United States Patent [19]
Li

[11] Patent Number: 6,023,778
[45] Date of Patent: Feb. 8, 2000

[54] METHOD AND APPARATUS FOR UTILIZING MUX SCAN FLIP-FLOPS TO TEST SPEED RELATED DEFECTS BY DELAYING AN ACTIVE TO INACTIVE TRANSITION OF A SCAN MODE SIGNAL

[75] Inventor: Hehching Harry Li, Portland, Oreg.

[73] Assignee: Intel Corporation, Santa Clara, Calif.

[21] Appl. No.: 08/989,838

[22] Filed: Dec. 12, 1997

[51] Int. Cl.[7] .................................................. G01R 31/28
[52] U.S. Cl. .......................................................... 714/726
[58] Field of Search ..................................... 714/733, 726, 714/724, 727, 729; 364/717; 326/16

[56] References Cited

U.S. PATENT DOCUMENTS

| | | | |
|---|---|---|---|
| 3,783,254 | 1/1974 | Eichelberger | 235/152 |
| 3,927,371 | 12/1975 | Pomeranz et al. | 324/73 |
| 4,262,329 | 4/1981 | Bright et al. | |
| 4,723,284 | 2/1988 | Munck et al. | |
| 4,786,790 | 11/1988 | Kruse et al. | |
| 4,801,870 | 1/1989 | Eichelberger et al. | 324/73 |
| 4,926,780 | 5/1990 | Chaum | |
| 5,224,160 | 6/1993 | Paulini et al. | |
| 5,265,164 | 11/1993 | Matyas et al. | |
| 5,329,533 | 7/1994 | Lin | 371/23.3 |
| 5,347,579 | 9/1994 | Blandford | |
| 5,349,587 | 9/1994 | Nadeau-Dostie et al. | 714/729 |
| 5,383,143 | 1/1995 | Crouch et al. | 364/717 |
| 5,533,032 | 7/1996 | Johnson | 714/733 |
| 5,546,406 | 8/1996 | Gillenwater et al. | 714/733 |
| 5,717,700 | 2/1998 | Crouch et al. | 714/726 |
| 5,805,608 | 9/1998 | Baeg et al. | 714/726 |
| 5,867,507 | 2/1999 | Beebe et al. | 714/726 |
| 5,872,793 | 2/1999 | Attaway et al. | 714/726 |
| 5,872,795 | 2/1999 | Parvathala et al. | 714/726 |

*Primary Examiner*—Albert De Cady
*Assistant Examiner*—Shelly A Chase
*Attorney, Agent, or Firm*—Blakely, Sokoloff, Taylor & Zafman LLP

[57] ABSTRACT

A method and an apparatus utilizing mux scan flip-flops to test for timing-related defects. In one embodiment, a delay circuit is used to act as a buffer for a scan enable signal received by the mux scan flip-flops of a test circuit. The scan mode signal is first sent to the delay circuit, which then distributes the scan mode signal to the mux scan flip-flops. Since each delay circuit can serve as the buffer for numerous mux scan flip-flops, the scan mode signal may be sent initially to a smaller number of delay circuits instead of the thousands of mux scan flip-flops that may be distributed throughout the entire integrated circuit. Furthermore, in one embodiment the delay circuit delays propagation of active-to-inactive transitions of the scan enable signal by one clock cycle, synchronizing the system clock cycle with the active-to-inactive transitions of the scan mode signal. In one embodiment, inactive-to-active transitions of the scan enable signal are propagated without the one clock cycle delay. With the present invention, the mux scan flip-flops may be loaded and unloaded with test data at slower scan clock speeds, and the integrated circuit may be operated at full system clock speeds for as few as two cycles to detect speed-related defects in accordance with the teachings of the present invention.

12 Claims, 8 Drawing Sheets

METHOD AND APPARATUS FOR UTILIZING MUX SCAN FLIP-FLOPS TO TEST SPEED RELATED DEFECTS BY DELAYING AN ACTIVE TO INACTIVE TRANSITION OF A SCAN MODE SIGNAL

BACKGROUND OF THE INVENTION

1. Field of the Invention

The present invention relates generally to integrated circuit technology, and, more specifically, the present invention relates to the testing of an integrated circuit.

2. Background Information

Integrated circuits are becoming more densely packed with increasing numbers of individual circuit elements. In fact, it is common for a single chip to have thousands of individual elements that include millions of transistors. One way of testing the circuit elements in an integrated circuit is performed by generating a test pattern and applying the test pattern to the inputs of the integrated circuit using mux scan flip-flops. Depending on the test pattern, the responses of the integrated circuit to the test pattern can provide an accurate indication of the existence or non-existence of defects.

During a typical testing sequence, a scan mode signal, also known as a scan enable signal, is sent to the integrated circuit to effect either system mode or test mode. In system mode, the integrated circuit functions as it normally does, while in test mode, the integrated circuit receives test patterns and performs other test operations. However, because of the continuing trend of increasing integrated circuit speeds and increasing device density, it is becoming increasingly difficult to send scan mode signals to all of the mux scan flip-flops in one system clock cycle. In addition, it is generally more difficult to test for timing-related defects, delay defects or transition defects using present day mux scan flip-flop implementations.

Figure 1:
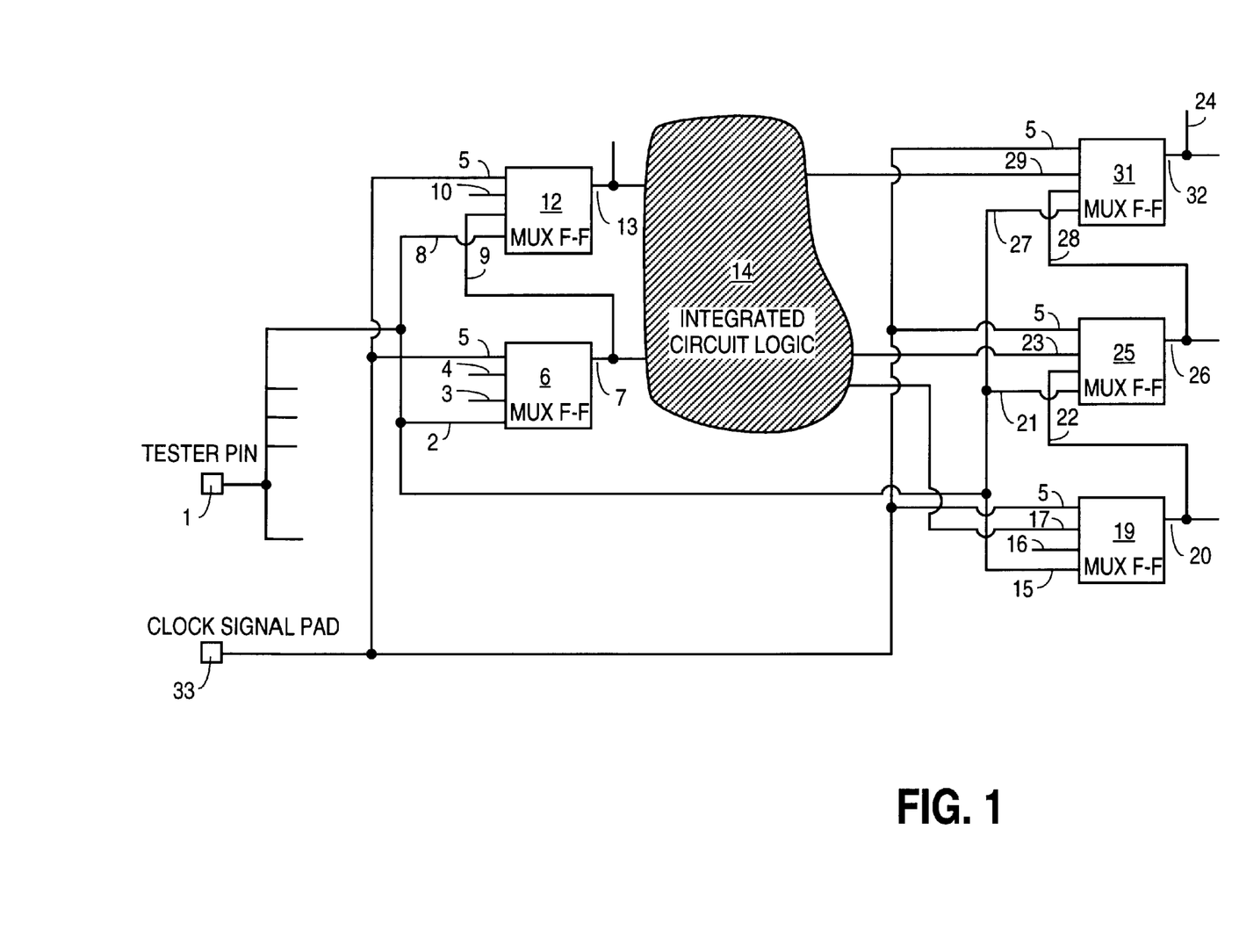
FIG. 1 is a block diagram of a present day test circuit utilizing mux scan flip-flops.

For instance, as depicted in the test circuit of FIG. 1, mux scan flip-flops 6, 12, 19, 25 and 31 are coupled to a single tester pin 1 via scan mode inputs 2, 8, 15, 21 and 27, respectively. A test pattern input 9 of mux scan flip-flop 12 is coupled to a data output 7 of mux scan flip-flop 6. Data outputs 7 and 13 are coupled to an integrated circuit logic 14. Data inputs 17, 23 and 29 of mux scan flip-flops 19, 25 and 31, respectively, are coupled to integrated circuit logic 14. A test pattern input 28 of mux scan flip-flop 31 is coupled to a data output 26 of mux scan flip-flop 25, and a test pattern input 22 of mux scan flip-flop 25 is coupled to a data output 20 of mux scan flip-flop 19.

Figure 2:
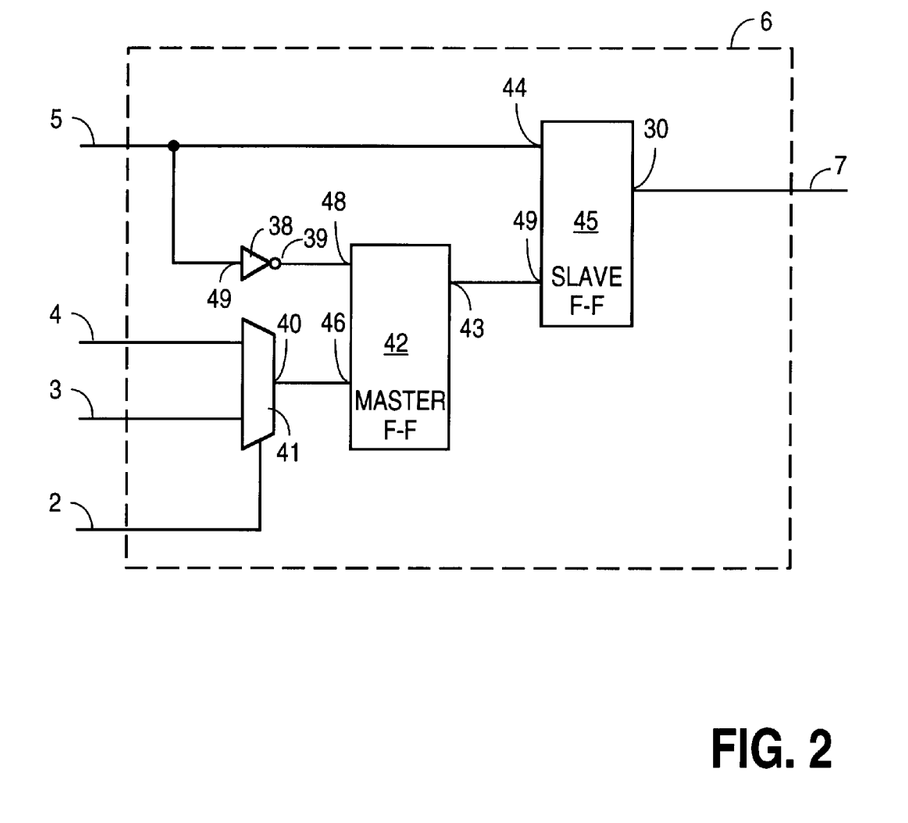
FIG. 2 is a block diagram of a present day mux scan flip-flop.

FIG. 2 illustrates the components of a mux scan flip-flop used in the test circuit of FIG. 1. With specific reference to mux scan flip-flop 6, FIG. 2 depicts a first stage 42, which can be a master flip-flop, coupled to an output 40 of a multiplexor 41 via a value input 46. A clock input 48 of first stage 42 is coupled to an output 39 of an inverter 38. A value output 43 of first stage 42 is coupled to a value input 47 of second stage 45, which can be a slave flip-flop. A value output 30 of second stage 45 acts as the data output 7 of mux scan flip-flop 6.

With reference to FIG. 1, tester pin 1 sends a scan mode signal with a logical value of either zero or one to mux scan flip-flops 6, 12, 19, 25 and 31, where a value of zero indicates an inactive scan mode signal and a value of one indicates an active scan mode signal. Specifically, a value of zero sets mux scan flip-flops 6, 12, 19, 25 and 31 to system mode, while a value of one sets mux scan flip-flops 6, 12, 19, 25 and 31 to scan enable mode. It should be emphasized that with an increasing number of mux scan flip-flops being disposed in integrated circuits and with continually increasing integrated circuit speeds, the scan mode signal takes more than one clock cycle to reach all of the mux scan flip-flops. In scan enable mode, at the beginning of a test sequence, mux scan flip-flops 6 and 19 receive the first bit of an N bit test pattern via test pattern inputs 3 and 16, respectively. N is the number of mux scan flip-flops in the scan chain that is receiving the test pattern. To illustrate, one scan chain in FIG. 1 includes mux scan flip-flops 6 and 12, making N equal to two, and a second scan chain includes mux scan flip-flops 19, 25 and 31, making N equal to three.

Mux scan flip-flops 6, 12, 19, 25 and 31 receive clock signals via a clock signal input 5 from clock signal pad 33. After one clock cycle, the first bit of the two bit test pattern sent to mux scan flip-flop 6 is ready to be latched in by mux scan flip-flop 12, to which the first bit was sent via data output 7 and test pattern input 9. During the next clock cycle, the second bit of the two bit test pattern is latched into mux scan flip-flop 6, and the first bit is latched into mux scan flip-flop 12. After that clock cycle, tester pin 1 sets mux scan flip-flops 6, 12, 19, 25 and 31 to system mode so that they can latch in data via data inputs 4, 10, 17, 23 and 29, respectively. Once system mode has been established, one clock cycle is needed to send the first and second bits from mux scan flip-flops 12 and 6, respectively, to integrated circuit logic 14 and to capture or latch in test output data from integrated circuit logic 14 into mux scan flip-flops 19, 25 and 31 via data inputs 17, 23 and 29, respectively. After the test output data is latched in, tester pin 1 sets mux scan flip-flops 6, 12, 19, 25 and 31 back to scan enable mode. Finally, the test output data captured in mux scan flip-flops 19, 25 and 31 is unloaded via scan output 24 in three more clock cycles, one for each mux scan flip-flop in that scan chain.

A limitation of present day test circuits such as the one depicted in FIG. 1 is that the mux scan flip-flops are generally restricted to identifying stuck-at faults in the integrated circuit. In stuck-at fault testing, the integrated circuit and the test patterns are generally clocked at speeds slower than the system clock speed, which means that timing-related defects are not identified. Thus, what is desired is a method and apparatus for utilizing mux scan flip-flops to test for speed-related defects in integrated circuits. Such a method and apparatus should be able to detect the speed-related defects in an integrated circuit without consuming excessive amounts of power.

SUMMARY OF THE INVENTION

A method and apparatus for utilizing mux scan flip-flops to test speed related defects is disclosed. In one embodiment, a delay circuit propagates a scan mode signal from a mode input to a mode output. The delay circuit receives a clock signal and propagates an active-to-inactive transition of the scan mode signal with a one clock cycle delay and an inactive-to-active transition of the scan mode signal without the one clock cycle delay. Each of the mux scan flip-flops receives the clock signal and has a scan mode input coupled to the mode output of the delay circuit. A data output of one of the mux scan flip-flops is coupled to an input of an integrated circuit logic, and a data input of another one of the mux scan flip-flops is coupled to an output of the integrated circuit logic. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and apparatus for utilizing mux scan flip-flops to test speed related defects is disclosed. In the following description numerous specific details are set forth in order to provide a thorough understanding of the present invention. It will be apparent, however, to one having ordinary skill in the art that the specific details need not be employed to practice the present invention. In other instances, well known materials or methods have not been described in detail in order to avoid obscuring the present invention.

One embodiment of the present invention utilizes a delay circuit to act as a buffer for the scan enable signal received by the mux scan flip-flops of a test circuit. Thus, instead of a scan mode signal being sent directly to each mux scan flip-flop, the scan mode signal is first sent to the delay circuit, which then distributes the scan mode signal to the mux scan flip-flops. Since each delay circuit can serve as the buffer for numerous mux scan flip-flops, the scan mode signal is sent initially to a smaller number of delay circuits instead of the thousands of mux scan flip-flops that may be distributed throughout the entire integrated circuit. Furthermore, as will be discussed in greater detail below, one embodiment of the presently described delay circuit synchronizes a system clock cycle with the active-to-inactive transition of the scan mode signal, thereby enabling the mux scan flip-flops to be loaded and unloaded with test data at slower scan speed, and allowing the integrated circuit to be operated at full system speed to detect speed-related defects.

Figure 3:
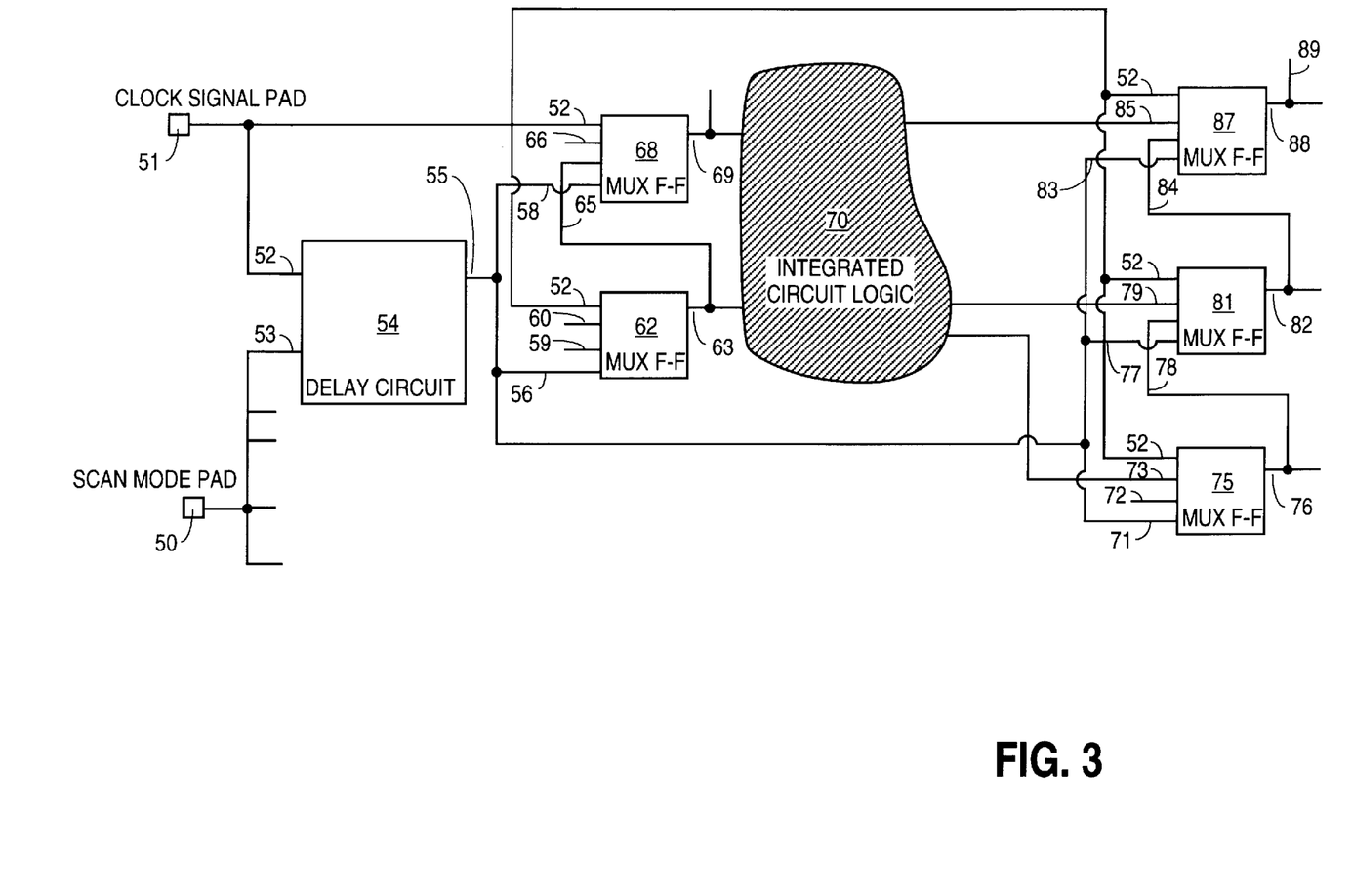
FIG. 3 is a block diagram of one embodiment of a test circuit with a delay circuit coupled to the mux scan flip-flops in accordance with the teachings of the present invention.

FIG. 3 illustrates one embodiment of a test circuit with a delay circuit 54 acting as a buffer for mux scan flip-flops 62, 68, 75, 81 and 87 in accordance with the teachings of the present invention. Delay circuit 54 is coupled to receive scan mode signals from a scan mode pad 50 via a mode input 53. In one embodiment, there are a plurality of delay circuits 54 distributed throughout the test circuit. Since there are a fewer number of delay circuits 54 than mux scan flip-flops 62, 68, 75, 81 and 87, the overall load on scan mode pad 50 is reduced. Delay circuit 54 is also coupled to receive clock signals from a clock signal pad 51 via a clock signal input 52. Scan mode inputs 56, 58, 71, 77 and 83 of mux scan flip-flops 62, 68, 75, 81 and 87, respectively, are coupled to a mode output 55 to receive the scan mode signal after it has passed through delay circuit 54. Each mux scan flip-flop 62, 68, 75, 81 and 87 has a clock signal input 52 coupled to clock signal pad 51 to allow the receipt of clock signals. A test pattern input 65 of mux scan flip-flop 68 is coupled to a data output 63 of mux scan flip-flop 62. Data outputs 63 and 69 are coupled to an integrated circuit logic 70. Data inputs 73, 79 and 85 of mux scan flip-flops 75, 81 and 87, respectively, are coupled to integrated circuit logic 14. A test pattern input 84 of mux scan flip-flop 87 is coupled to a data output 82 of mux scan flip-flop 81, and a test pattern input 78 of mux scan flip-flop 81 is coupled to a data output 76 of mux scan flip-flop 75.

Figure 4A:
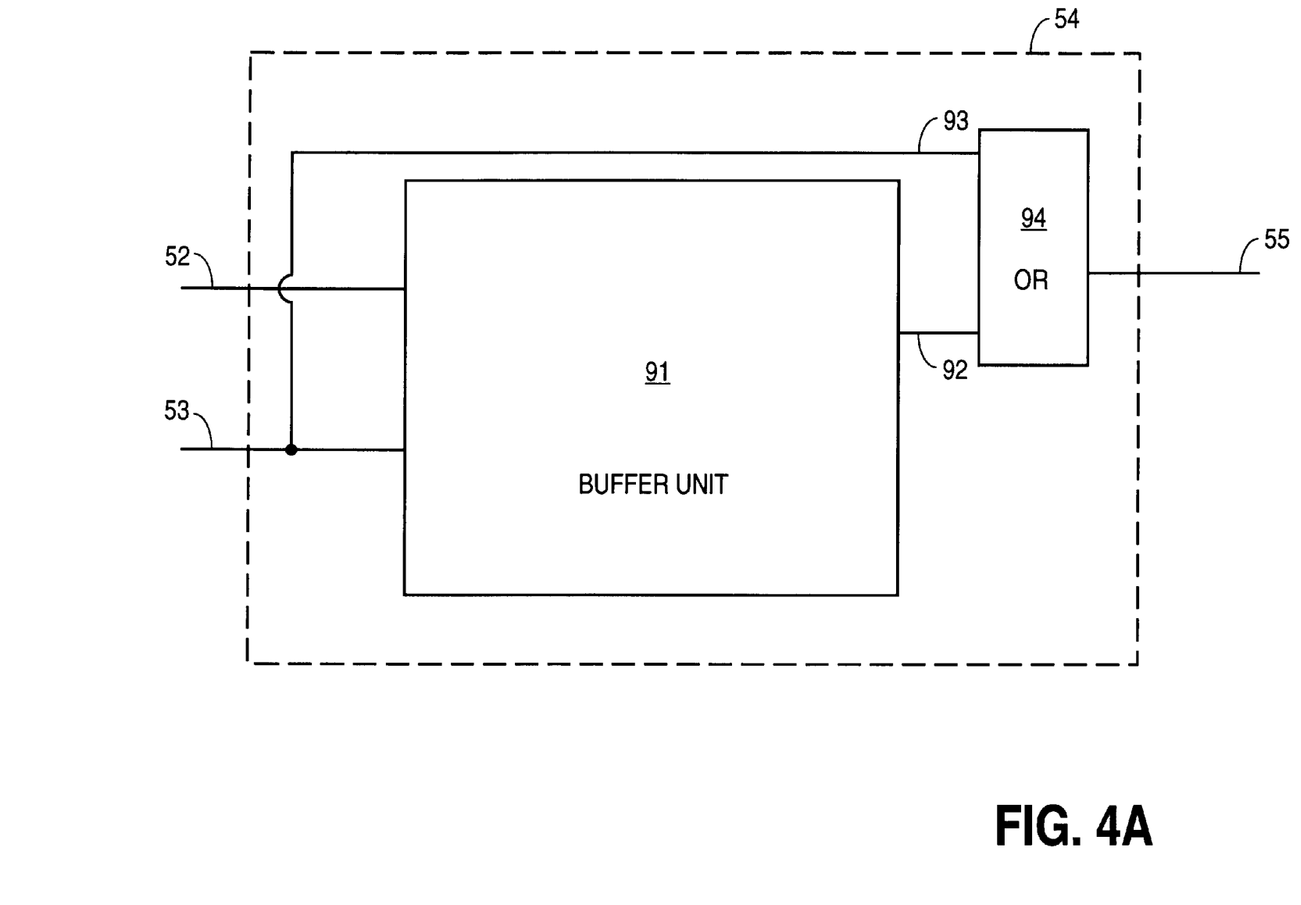
FIG. 4A is a block diagram of one embodiment of a delay circuit in accordance with the teachings of the present invention.

FIG. 4A illustrates in greater detail one embodiment of delay circuit 54. As shown, delay circuit 54 includes a buffer unit 91, which includes a clock signal input 52 and a mode input 53. A logical-OR gate 94 is coupled to an output of buffer unit 91 through an input 92. Logical-OR gate 94 also includes a mode signal input 93 coupled to mode input 53, and logical-OR gate 94 also includes a mode output 55 which acts as the mode output for delay circuit 54.

Figure 4B:
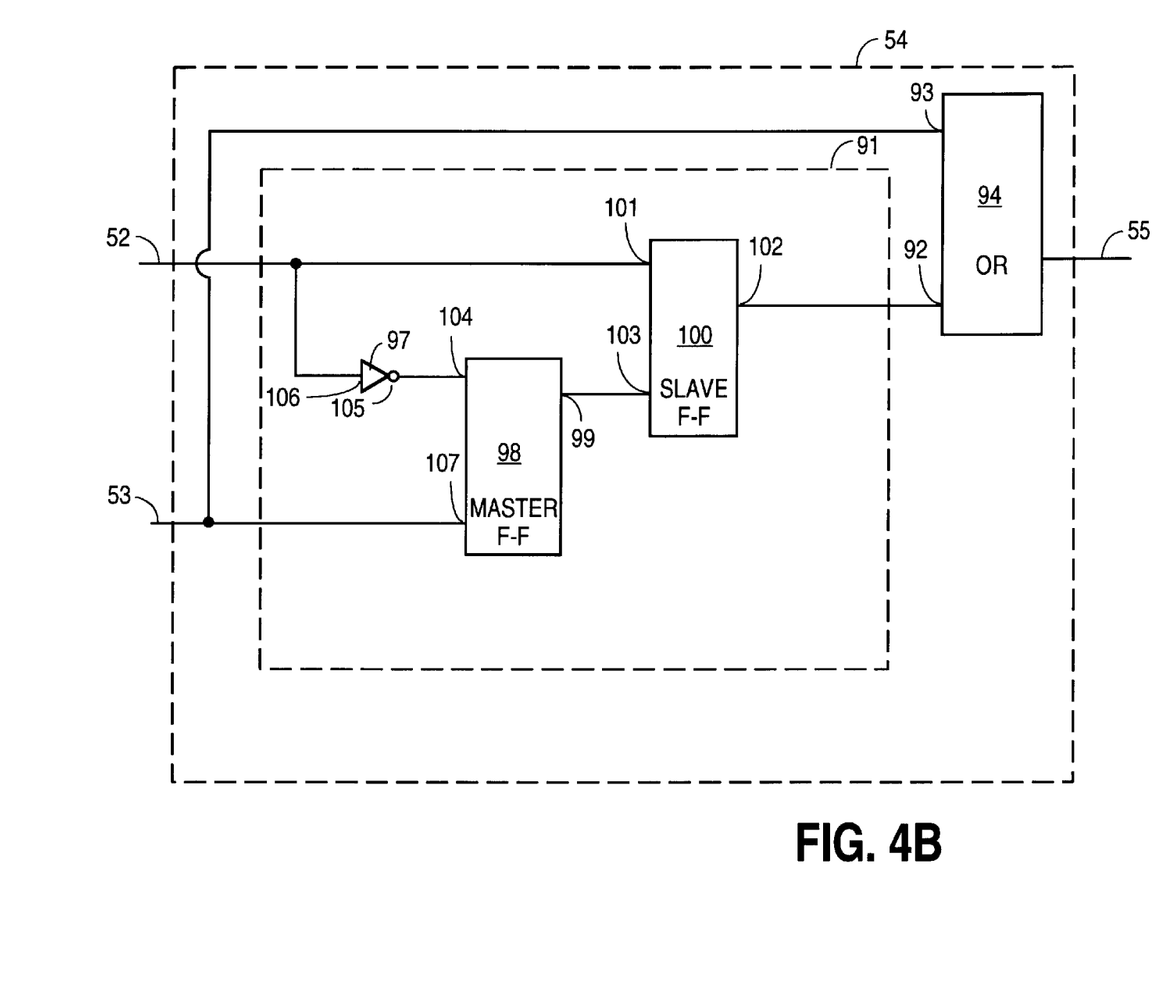
FIG. 4B is a block diagram of another embodiment of a delay circuit in accordance with the teachings of the present invention.

FIG. 4B illustrates another embodiment of delay circuit 54, which illustrates in greater detail the delay circuit shown in FIG. 4A. As shown, buffer unit 91 includes an inverter 97, a first stage 98, or master flip-flop, and a second stage 100, or slave flip-flop. A value input 107 of first stage 98 is coupled to mode input 53. An output 105 of inverter 97 is coupled to a clock input 104 of first stage 98. A value output 99 of first stage 98 is coupled to a value input 103 of second stage 100. A value output 102 of second stage 100 is coupled to logical-OR gate 94 via input 92.

Figure 5:
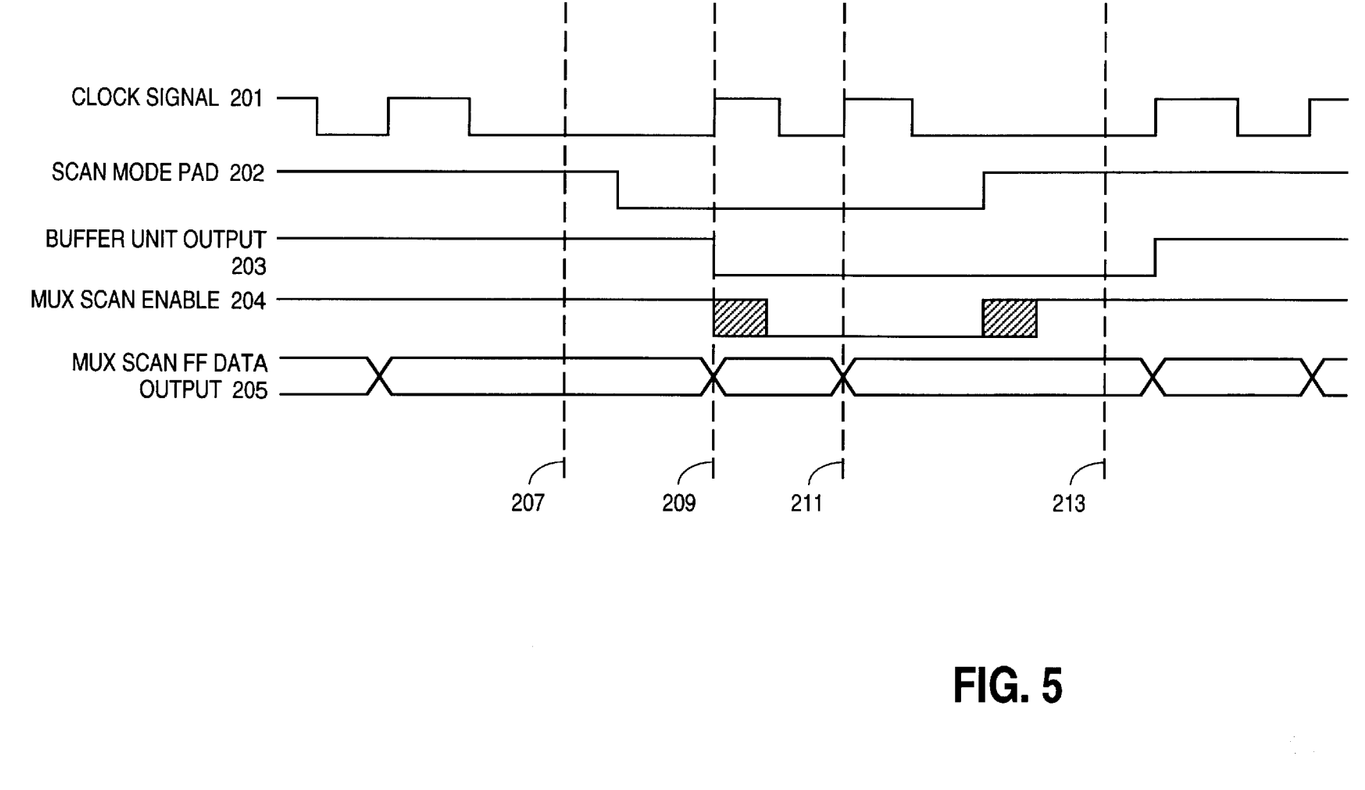
FIG. 5 is a timing diagram depicting the signals of the test circuit shown in FIGS. 3, 4A and 4B in accordance with the teachings of the present invention.

FIG. 5 is a timing diagram showing the relationship of signals in one embodiment of the test circuit of FIGS. 3, 4A and 4B in accordance with teachings of the present invention. Clock signal 201 is the value of the clock signal sent from clock signal pad 51 to clock signal input 52. Scan mode pad value 202 is the value of the scan mode signal sent from scan mode pad 50 to delay circuit 54. Specifically, scan mode pad value 202 is the value of the scan mode signal at mode signal input 93 of logical-OR gate 94. Buffer unit output value 203 is the output of the buffer unit 91 resulting from the input of the clock signal 201 and scan mode signal 202 at clock signal input 52 and mode input 53, respectively. Scan mode pad value 202 and buffer unit output value 203 are logically OR'ed by logical-OR gate 94 to produce the multiplexor scan enable signal value 204 that is sent to mux scan flip-flops 62, 68, 75, 81 and 87 via scan mode inputs 56, 58, 71, 77 and 83, respectively. Mux scan flip-flop data output 205 depicts the switching of data outputs, such as, for example, data outputs 63, 69, 76, 82 and 88.

With reference to FIGS. 3–5, a test sequence in accordance with the teachings of the present invention will now be described. Scan mode pad 50 sends a scan mode signal 202 with a value of either zero or one to delay circuit 54 via mode input 53. In one embodiment, a value of zero indicates an inactive scan mode signal 202 and a value of one indicates an active scan mode signal. The scan mode signal 202 propagates from mode input 53 to input 92 of logical-OR gate 94 in one clock cycle, while the scan mode signal 202 reaches mode signal input 93 of logical-OR gate 94 without the one clock cycle delay. In one embodiment, a value of zero from mode output 55 sets mux scan flip-flops 62, 68, 75, 81 and 87 to system mode, while a value of one sets mux scan flip-flops 62, 68, 75, 81 and 87 to scan enable mode.

Thus, to begin a test sequence, scan mode pad 50 sends a scan mode signal 202 with a value of one to delay circuit 54.

Once mux scan flip-flops 62, 68, 75, 81 and 87 are in scan enable mode, mux scan flip-flops 62 and 75 are the first to receive the first bits respective bits of N bit test patterns, where N is the number of mux scan flip-flops in the scan chain that is receiving the test pattern. Thus, in one embodiment, one scan chain consists of mux scan flip-flops 62 and 68, making N equal to two, and a second scan chain consists of mux scan flip-flops 75, 81 and 87, making N equal to three. It is appreciated that other embodiments of the present invention may include a greater or fewer number of scan chains with a greater or fewer number of mux scan flip-flops.

Clock signal pad 51 sends clock signals to mux scan flip-flops 62, 68, 75, 81 and 87. Assuming N equals two, after one clock cycle, N-1 bits or the first bit of the two bit test pattern has been latched into mux scan flip-flop 62, and the Nth or last bit of the test pattern is ready to be latched into mux scan flip-flop 62. This corresponds to dashed line 207 in FIG. 5. At this point, scan mode pad 50 sends a scan mode signal 202 with a value of zero to delay circuit 54 to set mux scan flip-flops 62, 68, 75, 81 and 87 to system mode. However, in one embodiment, the propagation of the active-to-inactive transition of the scan mode signal 202 through delay circuit 54 is delayed by one clock cycle. During the next clock cycle, which in one embodiment is run at full system speed, all of the following occur: the Nth or last bit of the N bit test pattern is latched into mux scan flip-flop 62, the N-1 bit is latched into mux scan flip-flop 68, and the inactive scan mode signal propagates through delay circuit 54, thereby setting mux scan flip-flops 62, 68, 75, 81 and 87 to system mode after the completion of the clock cycle. This corresponds to dashed line 209 of FIG. 5. As shown in FIG. 5, the delayed active-to-inactive transition of the scan mode signal 202, shown as multiplexor scan enable signal value 204, occurs in time to set mux scan flip-flops 62, 68, 75, 81 and 87 from scan enable mode to system mode to enable mux scan flip-flops 75, 81 and 87 to capture test output data from integrated circuit 70.

Once system mode has been established after the one clock cycle delay, the following clock cycle is also run at full system speed to send the test pattern loaded into mux scan flip-flops 68 and 62 to integrated circuit logic 70. During this next clock cycle at full system, speed the test output data from integrated circuit 70 is captured or latched in at data inputs 73, 79 and 85 of mux scan flip-flops 75, 81 and 87, respectively. It is noted that because this particular clock cycle is also run at full system speed, timing-related defects may be identified from the test output data latched into mux scan flip-flops 75, 81 and 87 at this time. This corresponds to dashed line 211 of FIG. 5. Scan mode pad 50 then sends an active scan mode signal 202 to delay circuit 54 in order to set mux scan flip-flops 62, 68, 75, 81 and 87 back to scan enable mode. In one embodiment, even though the scan mode signal 202 is first sent to delay circuit 54, an inactive-to-active transition of the scan mode signal 202 propagates through delay circuit 54 without a one clock cycle delay because of logical-OR gate 94. As shown in FIG. 5, the propagation of the inactive-to-active transition of the scan mode signal 202, shown as multiplexor scan enable signal value 204, occurs without the one cycle clock delay in time to set mux scan flip-flops 62, 68, 75, 81 and 87 from system mode back to scan allow mode to enable mux scan flip-flops 75, 81 and 87 to unload the test output data latched in from integrated circuit 70. In the embodiment illustrated in FIG. 3, unloading occurs through scan output 89 in three clock cycles. This unloading activity corresponds to the time after dashed line 213 in FIG. 5.

It is appreciated that in order to perform, as described above, the timing-related or transition defect test on a test circuit in accordance with the teachings of the present invention, as few as two of the clock cycles are run at full system speed; the remainder of the clock cycles may be run at a slower speed. Specifically, assuming the scan chain includes N mux scan flip-flops, the first N-1 clock cycles may be run at a slower clock speed when loading the first N-1 bits of the test pattern. The clock cycle that loads the Nth bit is pulsed and the integrated circuit under test is operated at full system speed during the next full system clock cycle in order to test timing-related defects. Afterwards, scan enable mode is reestablished and the mux scan flip-flops of the scan chain may be unloaded at the slower clock speed. It is appreciated that by operating the integrated circuit at the slower clock speed instead of the faster full system clock speed for a majority of the above described procedure, less power is consumed by the integrated circuit than the amount of power that would have been consumed if the entire test procedure had been operated at full system clock speed. As can be appreciated by those skilled in the art, loading and unloading all of the mux scan flip-flops at full system clock speed would require an excessive amount of power resulting from all of the mux scan flip-flops simultaneously switching at full system clock speed. In contrast, by switching the mux scan flip-flops at the slower clock speed for the majority of the test procedure during which N-1 bits of the N bit test pattern are loaded, substantially less power is consumed in accordance with the teachings of the present invention. It is also appreciated that another benefit of the present invention is that edge placement accuracy of the scan enable signal is no longer critical for testing integrated circuits for timing-related defects.

In one embodiment of the present invention, successive timing-related defect tests are run and, therefore, a dummy bit is loaded into the mux scan flip-flops before the test pattern bits are loaded into the mux scan flip-flops to offset the test patterns. This allows the unloading process of the test pattern to be completed at the slower clock speed when the loading process of a subsequent test pattern is one bit short of completion, thereby enabling the test data from a previous test to be unloaded from the mux scan flip-flops before the test circuit is operated at the full system clock speed for the subsequent test. For example, with reference to FIG. 3 and assuming N equals three, one dummy bit is loaded into mux scan flip-flop 75 before the first bit of a three bit test pattern is loaded into mux scan flip-flop 75. After three clock cycles, the dummy bit has been loaded into mux scan flip-flop 87, and the first two bits of the three bit test pattern have been loaded into mux scan flip-flops 81 and 75. During these three clock cycles, the test output data previously occupying mux scan flip-flops 75, 81 and 87 are unloaded. Thus, after three clock cycles, all run at a slower speed, the test output data have been completely unloaded and the loading process is one bit short of completion. The final bit of the three bit test pattern may now be loaded at full system clock speed without the test output data of the previous test having been unloaded at full system clock speed.

Figure 6A:
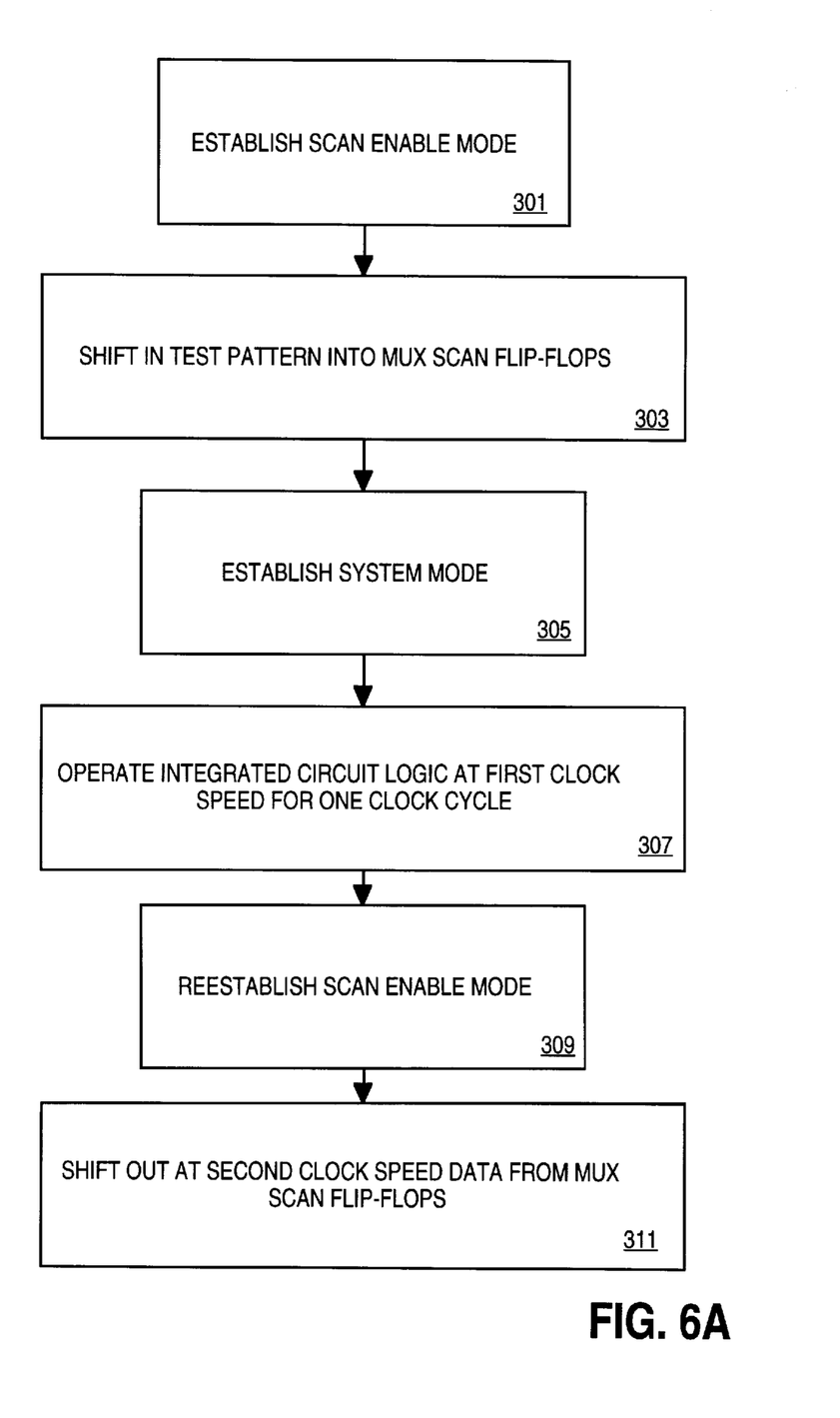
FIG. 6A is a flowchart illustrating one embodiment of steps performed in accordance with the teachings of the present invention.

FIG. 6A is a flowchart illustrating one embodiment steps performed in accordance with the teachings of the present invention. As shown in step 304, scan enable mode is established. Next, step 303 shows that a test pattern is shifted into the mux scan flip-flops. System mode is established in step 305 and then the integrated circuit logic is operated at a first clock speed for one clock cycle in step 307. Step 309 shows that scan enable mode is then reestablished and step 311 shows that data from the mux scan flip-flops is then shifted out at a second clock speed.

Figure 6B:
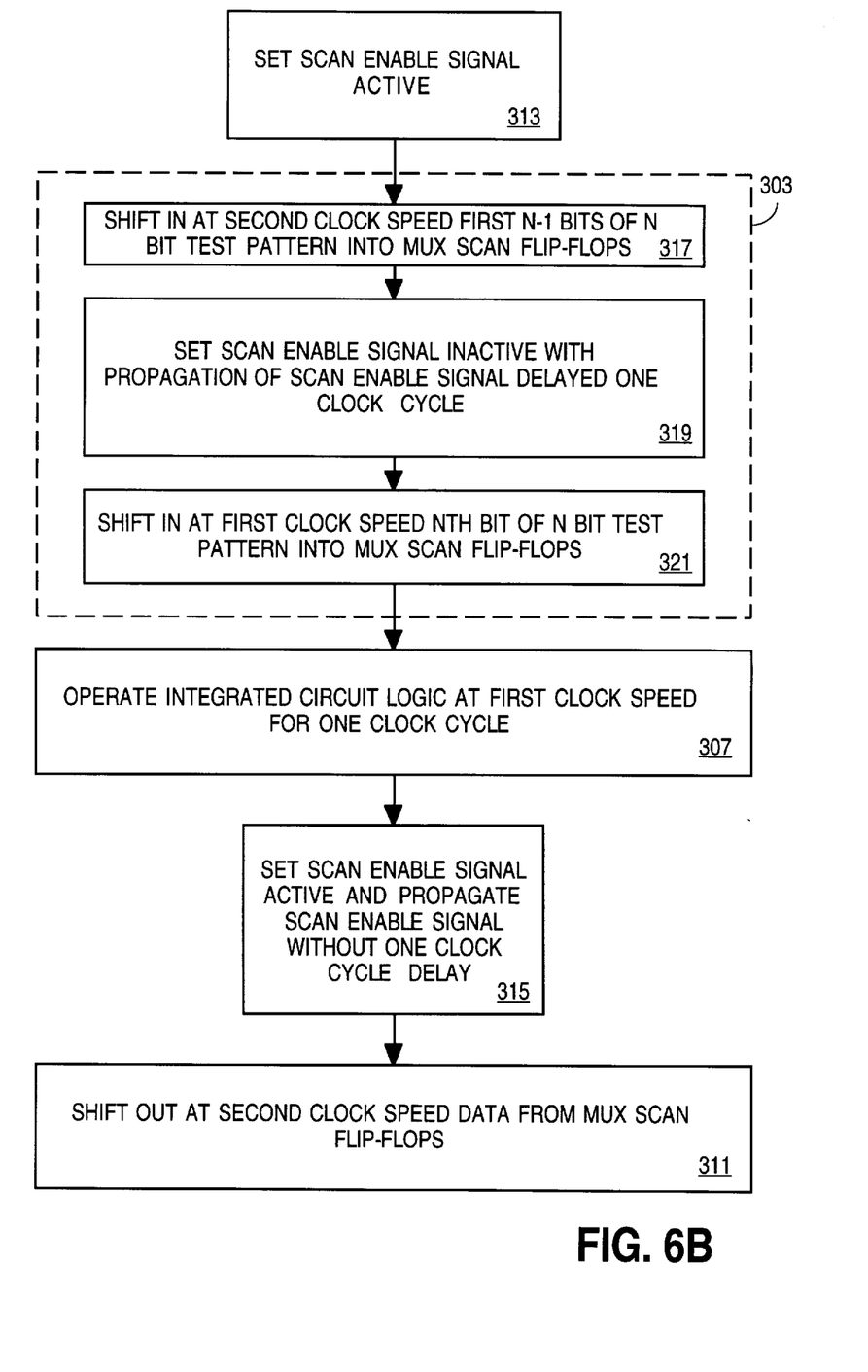
FIG. 6B is a flowchart illustrating another embodiment of steps performed in accordance with the teachings of the present invention.

FIG. 6B is a flowchart of another embodiment illustrating additional steps of the embodiment shown in the flowchart of FIG. 6A. In particular, step 311 shows that the scan enable signal is set active. Next, it is shown that step 303 includes the steps 317, 319 and 321. Step 317 shows that the first N-1 bits of an N bit test pattern are shifted into the mux scan flip-flops at the second clock speed. The scan enable signal is then set inactive with propagation of the scan enable signal delayed by one clock cycle, as shown in step 319. Step 321 shows that the Nth bit of the N bit test pattern is then shifted into the mux scan flip-flops at the first clock speed. After step 303 is performed, step 307 is performed as discussed above and then step 315 shows that the scan enable signal is set active with the scan enable signal propagating without the one clock cycle delay. Step 311 is then performed as discussed above.

Thus, in one embodiment, with the propagation delay of the inactive-to-active transition of the scan enable signal (step 319), the inactive scan enable signal is not received by the mux scan flip-flops until after said Nth bit of said N bit test pattern has been shifted into said plurality of mux scan flip-flops (step 321) and before the integrated circuit logic is operated at said first clock speed (step 307). With the inactive-to-active propagation of the scan enable signal without the one clock cycle delay (step 315), the active scan enable signal is received by said plurality of mux scan flip-flops after the integrated circuit logic is operated at the first clock speed (step 307) and before said N bit test pattern is shifted out at the second clock speed (step 311).

In the foregoing detailed description, the method and apparatus of the present invention have been described with reference to specific exemplary embodiments. However, it will be evident that various modifications and changes may be made without departing from the broader spirit and scope of the present invention. The present specification and figures are accordingly to be regarded as illustrative rather than restrictive.

What is claimed is:

1. A testing circuit for an integrated circuit logic, said testing circuit comprising:
    a delay circuit propagating a scan mode signal from a mode input to a mode output, said delay circuit receiving a clock signal and propagating an active-to-inactive transition of said scan mode signal with a one clock cycle delay and an inactive-to-active transition of said scan mode signal without the clock cycle delay; and
    a plurality of mux scan flip-flops, each one of said plurality of mux scan flip-flops receiving said clock signal and having a scan mode input coupled to said mode output of said delay circuit, a data input, a test pattern input, and a data output, wherein a data output of a first one of said plurality of mux scan flip-flops is coupled to an input of the integrated circuit logic and a data input of a second one of said plurality of mux scan flip-flops is coupled to an output of the integrated circuit logic.

2. The testing circuit of claim 1, wherein said delay circuit comprises:
    a flip-flop coupled to latch said scan mode signal in response to said clock signal; and
    a logical-OR gate coupled to receive said scan mode signal and an output of said flip-flop, said logical-OR having an output coupled to said mode output of said delay circuit.

3. The testing circuit of claim 2, wherein said flip-flop comprises:
    a first stage and a second stage, each of said first and second stages comprising a clock input, a value input and a value output; and
    an inverter coupled to said clock input of said first stage, an input of said inverter coupled to receive said clock signal;
    said value input of said first stage coupled to receive said scan mode signal;
    said value input of said second stage coupled to receive said value output of said first stage;
    said clock input of said second stage coupled to receive said clock signal;
    said value output of said second stage coupled to an input of said logical-OR gate.

4. The testing circuit of claim 1, wherein each one of said plurality of mux scan flip-flops comprises:
    a multiplexor coupled to select between said data input or said test pattern input in response to said scan mode input; and
    a flip-flop coupled to latch an output of said multiplexor and generate said data output in response to said clock signal.

5. A method for identifying speed related defects in an integrated circuit logic, said method comprising the steps of:
    establishing a scan enable mode in the integrated circuit logic;
    shifting in at a second clock speed a first N-1 bits of an N bit test pattern into a plurality of mux scan flip-flops of the integrated circuit logic;
    delaying an active to inactive transition of a scan enable signal from being received by said plurality of mux scan flip-flops until a following clock cycle;
    shifting in at a first clock speed an Nth bit of said N bit test pattern into said plurality of mux scan flip-flops before the following clock cycle;
    operating the integrated circuit logic at the first clock speed for one clock cycle during the following clock cycle;
    reestablishing said scan enable mode in the integrated circuit logic; and
    shifting out at a second clock speed said test pattern from said plurality of mux scan flip-flops.

6. The method of claim 5 including the additional step of setting active said scan enable signal received by said plurality of mux scan flip-flops before said step of shifting in said test pattern into said plurality of mux scan flip-flops of the integrated circuit logic.

7. The method of claim 5 wherein the step of delaying the active to inactive transition of the scan enable signal includes the step of delaying said inactive scan enable signal from being received by said plurality of mux scan flip-flops until after said Nth bit of said N bit test pattern has been shifted into said plurality of mux scan flip-flops and before the integrated circuit logic is operated at said first clock speed.

8. The method of claim 5 wherein the step of reestablishing said scan enable mode in the integrated circuit logic includes the step of setting active said scan enable signal received by said plurality of mux scan flip-flops after the integrated circuit logic is operated at said first clock speed and before said N bit test pattern is shifted out at said second clock speed.

9. The method of claim 5 wherein said first clock speed is a system clock speed of the integrated circuit logic, and wherein said first clock speed is faster than said second clock speed.

10. A testing circuit for an integrated circuit logic, said testing circuit comprising:

a delay circuit propagating a scan mode signal from a mode input to a mode output, said delay circuit receiving a clock signal and propagating an active-to-inactive transition of said scan mode signal with a one clock cycle delay and an inactive-to-active transition of said scan mode signal without the clock cycle delay, said delay circuit including a master-slave flip-flop coupled to latch said scan mode signal in response to said clock signal, and a logical-OR gate coupled to receive said scan mode signal and an output of said master-slave flip-flop, said logical-OR having an output coupled to said mode output of said delay circuit; and a plurality of mux scan flip-flops, each one of said plurality of mux scan flip-flops receiving said clock signal and comprising a scan mode input coupled to said mode output of said delay circuit, a data input, a test pattern input, and a data output, wherein a data output of a first one of said plurality of mux scan flip-flops is coupled to an input of the integrated circuit logic and a data input of a second one of said plurality of mux scan flip-flops is coupled to an output of the integrated circuit logic, each one of said plurality of mux scan flip-flops further including a multiplexor coupled to select between said data input or said test pattern input in response to said scan mode input, and a master-slave flip-flop coupled to latch an output of said multiplexor and generate said data output in response to said clock signal.

11. The testing circuit of claim 10, wherein said master-slave flip-flop of said delay circuit comprises:

a first stage and a second stage, each of said first and second stages comprising a clock input, a value input and a value output; and an inverter coupled to said clock input of said first stage, an input of said inverter coupled to receive said clock signal;

said value input of said first stage coupled to receive said scan mode signal;

said value input of said second stage coupled to receive said value output of said first stage;

said clock input of said second stage coupled to receive said clock signal;

said value output of said second stage coupled to said output of said master-slave flip-flop.

12. The testing circuit of claim 10, wherein said master-slave flip-flop of said mux scan flip-flop comprises:

a first stage and a second stage, each of said first and second stages comprising a clock input, a value input and a value output; and an inverter coupled to said clock input of said first stage, an input of said inverter coupled to receive said clock signal;

said value input of said first stage coupled to receive said output of said multiplexor;

said value input of said second stage coupled to receive said value output of said first stage;

said clock input of said second stage coupled to receive said clock signal;

said value output of said second stage coupled to said data output of said mux scan flip-flop.

* * * * *

UNITED STATES PATENT AND TRADEMARK OFFICE
CERTIFICATE OF CORRECTION

PATENT NO.    : 6,023,778
DATED         : February 8, 2000
INVENTOR(S)   : Li.

It is certified that error appears in the above-identified patent and that said Letters Patent is hereby corrected as shown below:

In column 5, at line 3, before "respective" delete "bits".

Signed and Sealed this

Twentieth Day of February, 2001

Attest:

NICHOLAS P. GODICI

Attesting Officer    Acting Director of the United States Patent and Trademark Office